(12) United States Patent
Yen et al.

(10) Patent No.: US 12,147,166 B2
(45) Date of Patent: *Nov. 19, 2024

(54) MITIGATING LONG-TERM ENERGY DECAY OF LASER DEVICES

(71) Applicant: TAIWAN SEMICONDUCTOR MANUFACTURING COMPANY, LTD., Hsinchu (TW)

(72) Inventors: Chih-Ping Yen, Hsinchu (TW); Yen-Shuo Su, Hsinchu (TW); Jui-Pin Wu, Hsinchu (TW); Chun-Lin Chang, Zhubei (TW); Han-Lung Chang, Kaohsiung (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/210,548

(22) Filed: Jun. 15, 2023

(65) Prior Publication Data

US 2023/0400787 A1  Dec. 14, 2023

Related U.S. Application Data

(63) Continuation of application No. 17/459,749, filed on Aug. 27, 2021, now Pat. No. 11,720,035.

(51) Int. Cl.
G03F 7/00 (2006.01)

(52) U.S. Cl.
CPC ...... G03F 7/70925 (2013.01); G03F 7/70025 (2013.01); G03F 7/70033 (2013.01); G03F 7/70916 (2013.01); G03F 7/70975 (2013.01)

(58) Field of Classification Search
CPC ............ G03F 7/70033; G03F 7/70025; G03F 7/70916; G03F 7/70958; G03F 7/70991;
(Continued)

(56) References Cited

U.S. PATENT DOCUMENTS

| 4,188,592 A | 2/1980 | Buczek et al. |
| 4,651,324 A | 3/1987 | Prein et al. |

(Continued)

FOREIGN PATENT DOCUMENTS

| EP | 0081081 A1 * | 6/1983 | |
| WO | WO-2021204482 A1 * | 10/2021 | ......... G03F 7/70025 |

OTHER PUBLICATIONS

English translation of EP0081081. (Year: 1983).*
Notice of Allowance issued in U.S. Appl. No. 17/459,749 dated Mar. 15, 2023.

*Primary Examiner* — Christina A Riddle
(74) *Attorney, Agent, or Firm* — STUDEBAKER & BRACKETT PC

(57) ABSTRACT

An apparatus for manufacturing semiconductors includes a power amplifier to power a laser, a catalyst disposed in the power amplifier, an inlet port, and an exhaust port. The inlet port introduces a mixing gas to an interior of the power amplifier during a cleaning operation so that the mixing gas contacts a surface of the catalyst having a build-up thereon. The mixing gas reacts with and removes the build-up by generating gaseous by-products. The exhaust port removes the gaseous by-products from the power amplifier.

20 Claims, 8 Drawing Sheets

(58) Field of Classification Search
CPC ....... G03F 7/70; G03F 7/70908–70941; G03F 7/7095; G03F 7/70975; H05G 2/00–008; H01S 3/00; H01S 3/0014; H01S 3/02; H01S 3/025; H01S 3/027; H01S 3/03; H01S 3/0305; H01S 3/036; H01S 3/0388; H01S 3/0619; H01S 3/625; H01S 3/10; H01S 3/10007; H01S 3/10015; H01S 3/102–104; H01S 3/22; H01S 3/2207; H01S 3/223; H01S 3/2232; H01S 3/2308; H01S 3/13; H01S 3/1301–1302; H01S 3/1303; H01S 3/1305; H01S 3/1306; H01S 3/131–134; H01S 3/235; H01S 3/2366; H01S 3/031; H01S 5/02235; B08B 9/0321; B08B 9/0323; B08B 5/02; G02B 27/0006; G02B 1/16; G02B 1/18
USPC ........ 355/18, 30, 52–55, 67–77, 133; 430/5, 430/22, 30, 394; 372/29.01, 29.014, 372/29.02, 29.021, 31, 33, 55, 59, 60, 372/705; 250/492.1, 492.2, 492.22, 250/493.1, 503.1
See application file for complete search history.

(56) References Cited

U.S. PATENT DOCUMENTS

| | | |
|---|---|---|
| 4,756,000 A | 7/1988 | Macken |
| 8,929,419 B1 | 1/2015 | Dean et al. |
| 11,720,035 B2 * | 8/2023 | Yen ..................... G03F 7/70025 430/394 |
| 2013/0034118 A1 | 2/2013 | Bragin et al. |
| 2015/0222083 A1 | 8/2015 | Zhang et al. |
| 2018/0031982 A1 | 2/2018 | Nienhuys et al. |

* cited by examiner

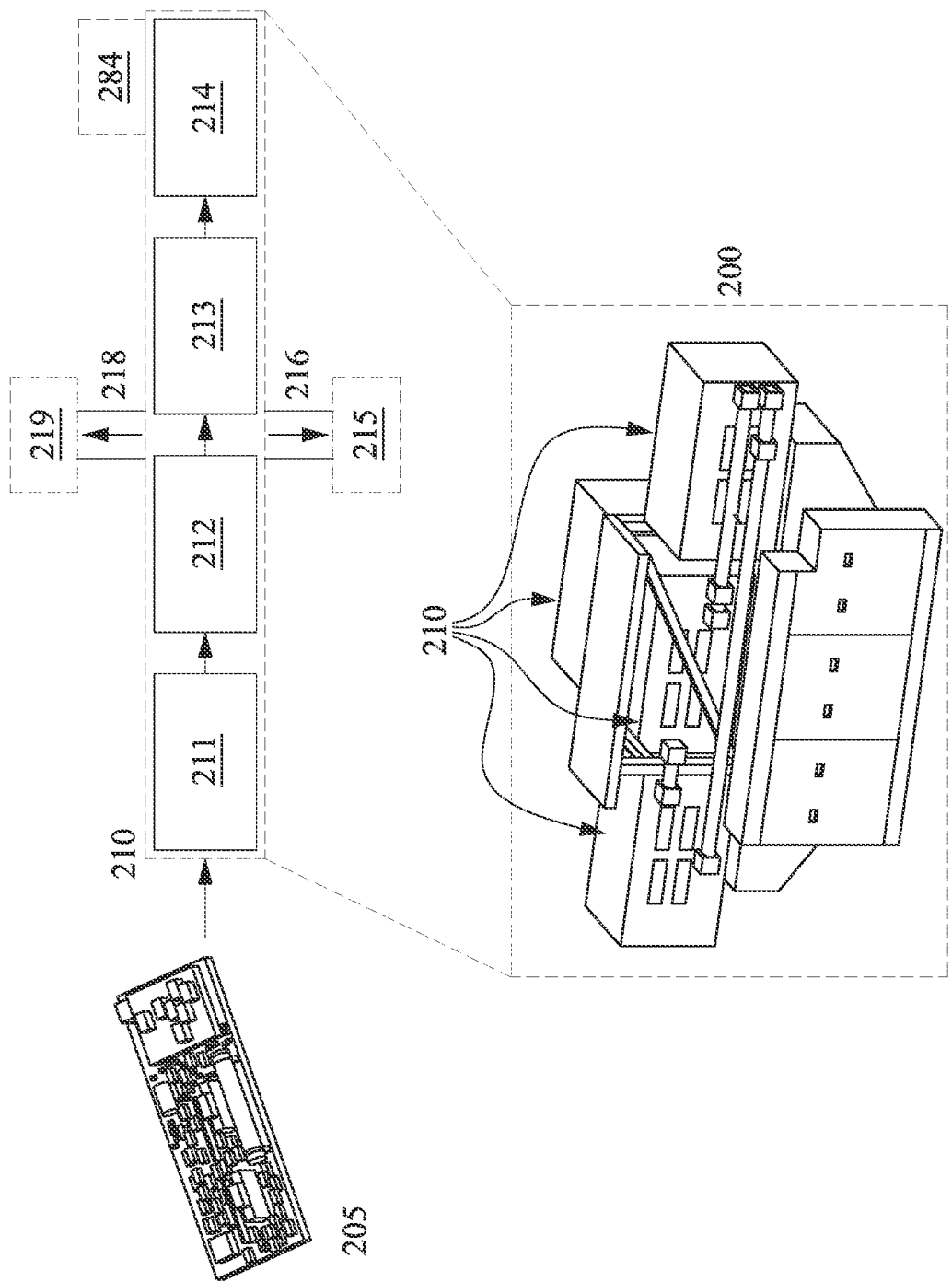

MITIGATING LONG-TERM ENERGY DECAY OF LASER DEVICES

PRIORITY CLAIM AND CROSS-REFERENCE

This application is a continuation of U.S. patent application Ser. No. 17/459,749 filed on Aug. 27, 2021, entitled "MITIGATING LONG-TERM ENERGY DECAY OF LASER DEVICES," the entire disclosure of which is incorporated herein by reference.

BACKGROUND

Technological advances in semiconductor manufacturing and design have produced successive generations of semiconductor devices with ever smaller and more complex circuits and structures. In the course of their evolution, functional density, namely the number of interconnected devices per chip area, has generally increased while geometric size (the smallest line, structure or component that may be created during fabrication) has decreased. This scaling-down process generally increases semiconductor processing efficiency, thus lowering overall production costs. However, these benefits come with increased processing complexity in both their design and manufacture.

In order to continually achieve smaller geometric sizes, ever higher-resolution lithography processes are necessarily required. One growing lithography technique is extreme ultraviolet (EUV) lithography. EUV employs scanners using light in the EUV spectrum of electromagnetic radiation, including wavelengths from about one nanometer (nm) to about one hundred nm. Many EUV scanners still utilize projection printing, similar to various earlier optical scanners, except EUV scanners accomplish it with reflective rather than refractive optics, that is, with mirrors instead of lenses. In particular, EUV lithography employs a laser-produced plasma (LPP), which emits EUV light. By focusing a high-power laser beam, as generated by a carbon dioxide (CO2) laser and the like, onto small fuel droplet targets in order to transition it into a highly-ionized LPP. This plasma emits EUV light with a peak maximum emission of about 13.5 nm or smaller. The EUV light is then collected by a collector and reflected by optics towards a lithography exposure object, such as a semiconductor wafer. Although existing methods and devices for generating EUV light have been adequate for their intended purposes, they have not been entirely satisfactory in all respects. In particular, a long term energy decay in the power of the laser occurs, in the range 10% per year or more. Replacement or repair of these lasers are time-consuming and expensive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is diagram of a laser source apparatus in accordance with some embodiments.

DETAILED DESCRIPTION

Figure 1A:
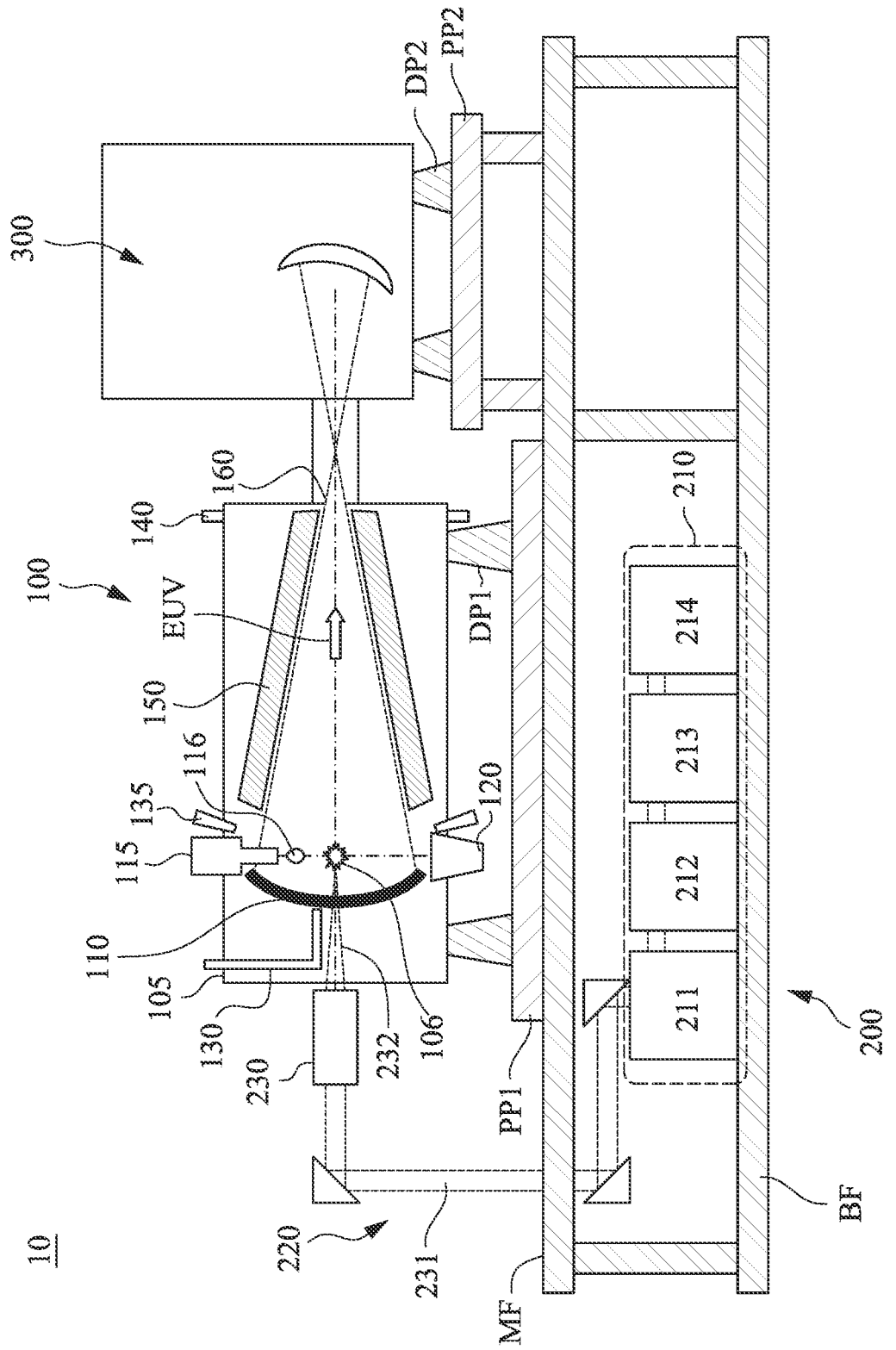
FIG. 1A is a diagram of a lithography apparatus in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, the term "optic," as used herein, is not meant to be limited to components which operate solely within one or more specific wavelength range(s) such as at the EUV output light wavelength, the irradiation laser wavelength, a wavelength suitable for metrology or any other specific wavelength.

In the present disclosure, the terms mask, photomask, and reticle are used interchangeably. In the present embodiment, the mask is a reflective mask. One embodiment of the mask includes a substrate with a suitable material, such as a low thermal expansion material or fused quartz. In various examples, the material includes $TiO_2$ doped $SiO_2$, or other suitable materials with low thermal expansion. The mask includes multiple reflective layers deposited on the substrate. The multiple layers include a plurality of film pairs, such as molybdenum-silicon (Mo/Si) film pairs (e.g., a layer of molybdenum above or below a layer of silicon in each film pair). Alternatively, the multiple layers may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the multiple layers. The absorption layer is patterned to define a layer of an integrated circuit (IC). Alternatively, another reflective layer may be deposited over the multiple layers and is patterned to define a layer of an integrated circuit, thereby forming an EUV phase shift mask.

In the present embodiments, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes. The lithography system may further include other modules or be integrated with (or be coupled with) other modules.

A lithography system is essentially a projection system. Light is projected through a blueprint of the pattern that will be printed, and is known as a 'mask' or 'reticle.' The blueprint is four times larger than the intended pattern on the chip. With the pattern encoded in the light, the system's optics shrink and focus the pattern onto a photosensitive silicon wafer. After the pattern is printed, the system moves the wafer slightly and makes another copy on the wafer. This process is repeated until the wafer is covered in patterns, completing one layer of the eventual semiconductor device. To make an entire microchip, this process will be repeated one hundred times or more, laying patterns on top of patterns. The size of the features to be printed varies depending on the layer, which means that different types of lithography systems are used for different layers, from the latest-generation EUV systems for the smallest features to older deep ultraviolet (DUV) systems for the largest.

FIG. 1A is a schematic and diagrammatic view of an EUV lithography system 10. The EUV lithography system 10 includes an EUV radiation source apparatus 100 to generate EUV light, an exposure tool 300, such as a scanner, and an excitation laser source apparatus 200. As shown in FIG. 1A, in some embodiments, the EUV radiation source apparatus 100 and the exposure tool 300 are installed on a main floor MF of a clean room, while the excitation laser source apparatus 200 is installed in a base floor BF located under the main floor. Each of the EUV radiation source apparatus 100 and the exposure tool 300 are placed over pedestal plates PP1 and PP2 via dampers DP1 and DP2, respectively. The EUV radiation source apparatus 100 and the exposure tool 300 are coupled to each other by a coupling mechanism, which may include a focusing unit (not shown).

The EUV lithography system 10 is designed to expose a resist layer to EUV light (or EUV radiation). The resist layer is a material sensitive to the EUV light. The EUV lithography system 10 employs the EUV radiation source apparatus 100 to generate EUV light having a wavelength ranging between about 1 nanometer (nm) and about 100 nm. In one particular example, the EUV radiation source apparatus 100 generates an EUV light with a wavelength centered at about 13.5 nm. In various embodiments, the EUV radiation source apparatus 100 utilizes a mechanism of laser-produced plasma (LPP) to generate the EUV radiation.

As shown in FIG. 1A, the EUV radiation source apparatus 100 includes a target droplet generator 115 and a LPP collector 110, enclosed by a chamber 105. The target droplet generator 115 generates a plurality of target droplets 116. In some embodiments, the target droplets 116 are tin (Sn) droplets. In some embodiments, the tin droplets each have a diameter of about 30 microns (µm). In some embodiments, the target droplets 116 are generated at a rate about fifty droplets per second and are introduced into an excitation zone 106 at a speed of about seventy meters per second (m/s or mps). Other material can also be used for the target droplets 116, for example, a liquid material such as a eutectic alloy containing Sn and lithium (Li).

As the target droplets 116 move through the excitation zone 106, pre-pulses (not shown) of the laser light first heat the target droplets 116 and transform them into lower-density target plumes. Then, the main pulse 232 of laser light is directed through windows or lenses (not shown) into the excitation zone 106 to transform the target plumes into a LLP. The windows or lenses are composed of a suitable material substantially transparent to the pre-pulses and the main pulse 232 of the laser. The generation of the pre-pulses and the main pulse 232 is synchronized with the generation of the target droplets 116. In various embodiments, the pre-heat laser pulses have a spot size about 100 micrometers (µm) or less, and the main laser pulses have a spot size about 200-300 µm. A delay between the pre-pulse and the main pulse 232 is controlled to allow the target plume to form and to expand to an optimal size and geometry. When the main pulse 232 heats the target plume, a high-temperature LPP is generated. The LPP emits EUV radiation, which is collected by one or more mirrors of the LPP collector 110. More particularly, the LPP collector 110 has a reflection surface that reflects and focuses the EUV radiation for the lithography exposing processes. In some embodiments, a droplet catcher 120 is installed opposite the target droplet generator 115. The droplet catcher 120 is used for catching excess target droplets 116 for example, when one or more target droplets 116 are purposely or otherwise missed by the pre-pulses or main pulse 232.

The LPP collector 110 includes a proper coating material and shape to function as a mirror for EUV collection, reflection, and focusing. In some embodiments, the LPP collector 110 is designed to have an ellipsoidal geometry. In some embodiments, the coating material of the collector 100 is similar to the reflective multilayer of an EUV mask. In some examples, the coating material of the LPP collector 110 includes multiple layers, such as a plurality of molybdenum/silicon (Mo/Si) film pairs, and may further include a capping layer (such as ruthenium (Ru)) coated on the multiple layers to substantially reflect the EUV light.

The main pulse 232 is generated by the excitation laser source apparatus 200. In some embodiments, the excitation laser source apparatus 200 includes a pre-heat laser and a main laser. The pre-heat laser generates the pre-pulse that is used to heat or pre-heat the target droplet 116 in order to create a low-density target plume, which is subsequently heated (or reheated) by the main pulse 232, thereby generating increased emission of EUV light.

The excitation laser source apparatus 200 may include a laser generator 210, laser guide optics 220 and a focusing apparatus 230. In some embodiments, the laser generator 210 includes a carbon dioxide ($CO_2$) laser source or a neodymium-doped yttrium aluminum garnet (Nd:YAG) laser source. The laser light 231 generated by the laser generator 210 is guided by the laser guide optics 220 and focused into the main pulse 232 of the excitation laser by the focusing apparatus 230, and then introduced into the EUV radiation source apparatus 100 through one or more apertures, such as the aforementioned windows or lenses, In such an EUV radiation source apparatus 100, the plasma caused by the main pulse 232 creates physical debris, such as ions, gases and atoms of the droplet, as well as the desired EUV radiation. In operation of the lithography system 10, there is an accumulation of such debris on the LPP collector 110, and such physical debris exits the chamber 105 and enters the exposure tool 300 and the excitation laser source apparatus 200.

In various embodiments, a buffer gas is supplied from a first buffer gas supply 130 through the aperture in the LPP collector 110 by which the main pulse 232 of laser light is delivered to the tin droplets 116. In some embodiments, the buffer gas is hydrogen ($H_2$), helium (He), argon (Ar), nitrogen ($N_2$), or another inert gas. In certain embodiments, $H_2$ is used, since H radicals generated by ionization of the buffer gas can also be used for cleaning purposes. The buffer gas can also be provided through one or more second buffer gas supplies 135 toward the LPP collector 110 and/or around the edges of the LPP collector 110. Further, and as described in more detail later below, the chamber 105 includes one or more gas outlets 140 so that the buffer gas is exhausted outside the chamber 105.

Hydrogen gas has low absorption of the EUV radiation. Hydrogen gas reaching to the coating surface of the LPP collector 110 reacts chemically with a metal of the target droplet 116, thus forming a hydride, e.g., metal hydride. When tin (Sn) is used as the target droplet 116, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber and to prevent the $SnH_4$ from entering the exposure tool 300 and the excitation laser source apparatus 200. To trap the $SnH_4$ or other debris, one or more debris collection mechanisms or devices 150 are employed in the chamber 105.

Figure 1B:
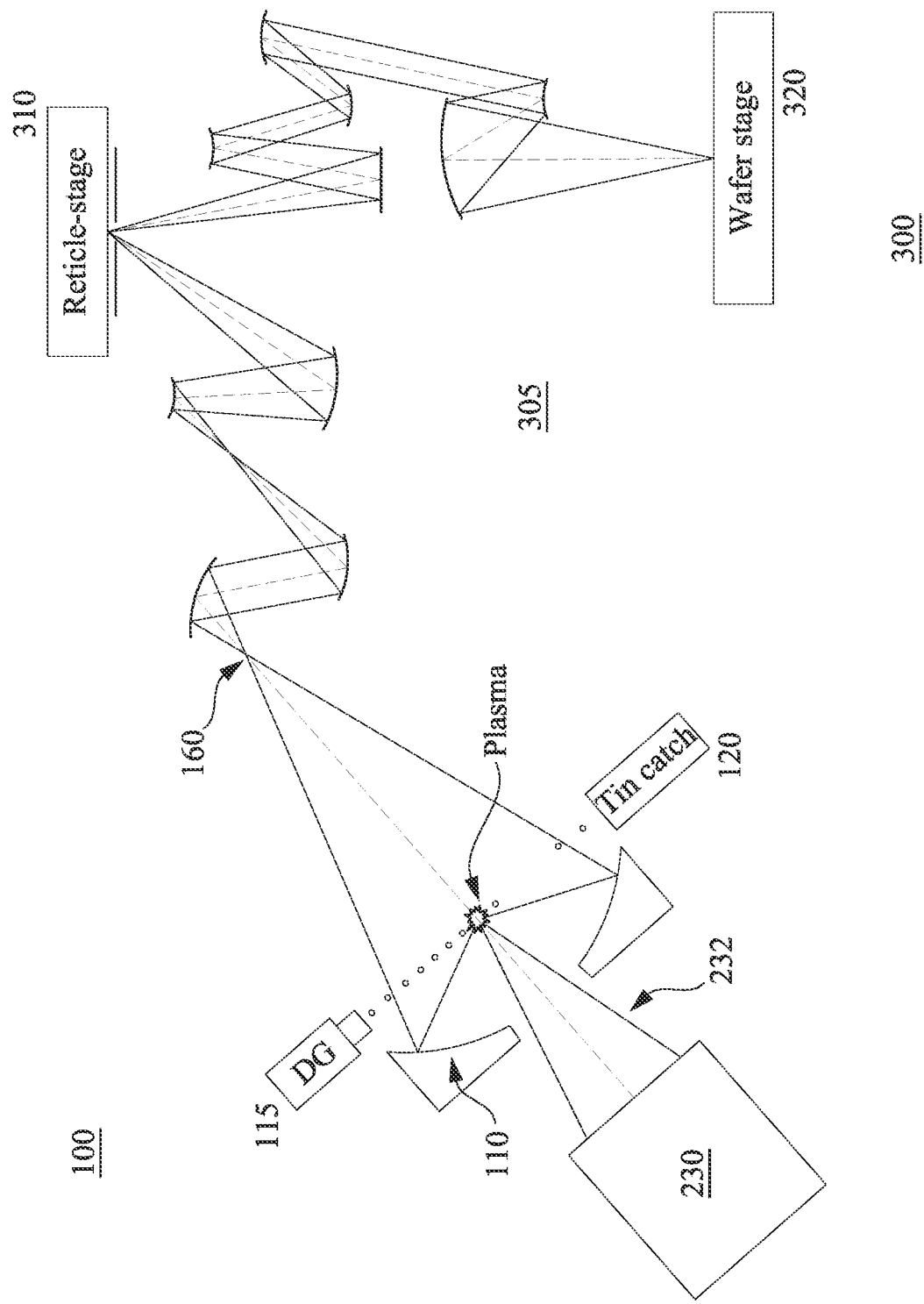
FIG. 1B and FIG. 1C are diagram of laser and optics components in accordance with some embodiments.

As shown in FIG. 1B, the exposure tool 300 includes various reflective optic components, such as convex/concave/flat mirrors, a mask holding mechanism 310 including a mask stage (i.e., a reticle), and wafer holding mechanism 320. The EUV radiation generated by the EUV radiation source apparatus 100 and focused at intermediate focus 160 is guided by the reflective optical components 305 onto a mask (not shown) secured on the reticle stage 310, also referenced as a mask stage herein. In some embodiments, the reticle stage 310 includes an electrostatic chuck, or 'e-chuck,' (not shown) to secure the mask. The EUV light patterned by the mask is used to process a wafer supported on wafer stage 320. Because gas molecules absorb EUV light, the chambers and areas of the lithography system 10 used for EUV lithography patterning are maintained in a vacuum or a low-pressure environment to avoid EUV intensity loss.

Figure 1C:
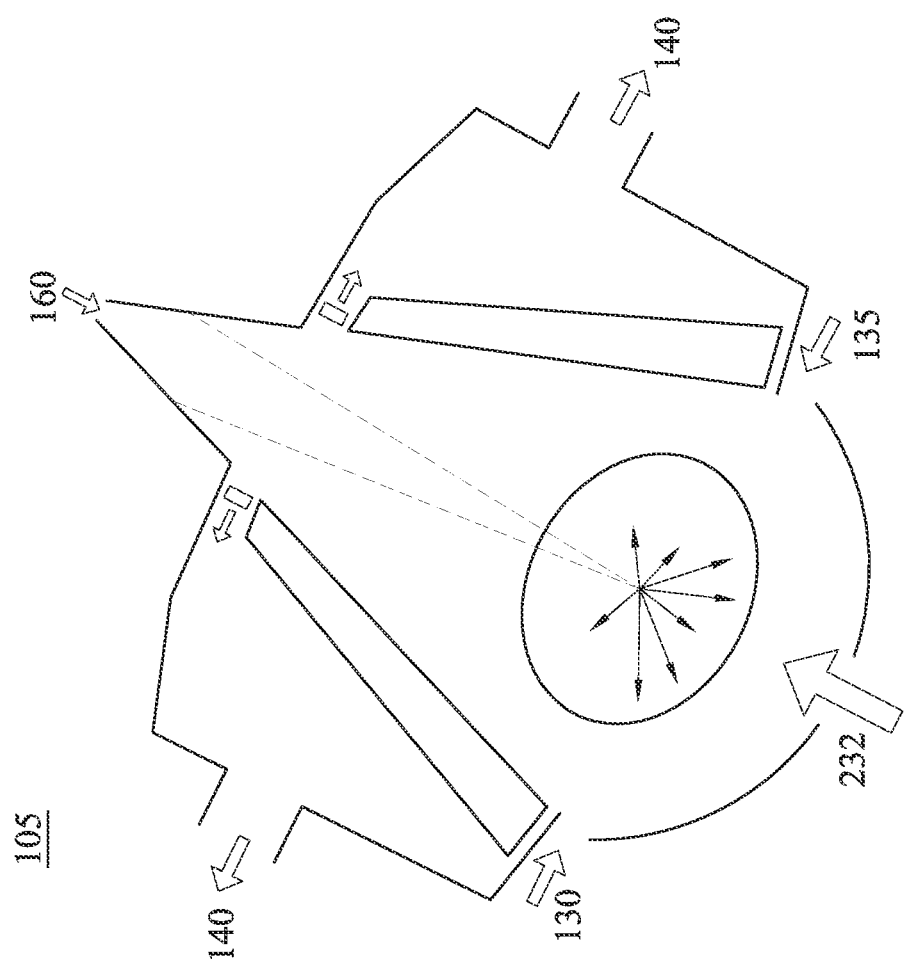

FIG. 1C shows further detail of the chamber 105 in which the relation of the LPP collector 110, the buffer gas supply 130, the second buffer gas supply 135 and the gas outlet ports 140 is illustrated. The main pulse 232 of the laser light is directed through the LPP collector 110 to the excitation zone 106 where it irradiates a target plume to form a plasma. The plasma emits EUV light that is collected by the LPP collector 110 and directed through the intermediate focus 160 toward the exposure tool 300 for use in patterning a wafer as described herein.

FIG. 2 depicts an excitation laser source apparatus 200 in accordance with various embodiments. The excitation laser source apparatus 200 includes a laser generator 210 having a number of power amplifiers (211, 212, 213 and 214). During laser operation, power is provided from and controlled by a high power switching module (HPSM) 205, which activates the various power amplifiers, for example, to operate in the normal course and to compensate for any modulations in the output power of the laser. Where the laser is a gas laser, such as a CO2 laser, the laser generator 210 has an internal gas circulation system (not shown) for utilizing the gas, in conjunction with a catalyst disposed internally within one or more of the power amplifiers (211-214). In various embodiments, the catalyst is gold (Au) surfaced or plated. In some embodiments, and as described in greater detail further below, the catalyst comprises layers or alternating layers of metals, such nickel (Ni) and copper (Cu). In some embodiments, a gold layer is disposed on the top surface of the catalyst. In some embodiments, the CO2 operating gas, which breaks down into carbon monoxide (CO) and oxygen (O2) during operation of the laser interact with silicon-based operating components of the laser generator 210 or power amplifiers (211-214) to form a layer of build-up or contamination on the surface of the catalyst. In various embodiments, the contamination may be a layer of silicon dioxide (SiO2).

In various embodiments, as shown in FIG. 2, the laser generator 210 of the excitation laser source apparatus 200 includes one or more mixing gas inlet ports 216 for providing the mixing gas to the gas circulation pipelines of the power amplifiers 211-214, and at least one mixing gas exhaust port 218 for removing the mixing gas and gaseous by-products from the gas circulation pipeline as or after a cleaning period ends. In some embodiments, the mixing gas inlet port(s) 216 are connected to a mixing gas supply 215. In some embodiments, the mixing gas supply 215 is a dedicated supply line or storage tank that transport or store a supply of the mixing gas, respectively, for on-demand use during a cleaning of the power amplifiers 211-214.

In various embodiments, the mixing gas outlet port(s) 218 is/are connected to a filter 219 for evacuating the mixing gas and gaseous by-products, as created during the cleaning process, from the gas circulation line of the power amplifiers 211-214. In some embodiments, the filter 219 is further connected to a purging system or a storage system (not shown) for proper storage and removal of the purged mixing gas and by-products. In various embodiments, the filter 219 is connected to a water supply, such that the water filters the evacuated mixing gas and by-products. In some embodiments, the water supply selectively filters out recovered mixing gas from the gaseous by-products. In some embodiments, the filter 219 includes a water scrubber. In some embodiments, the recovered mixing gas can be selectively captured, contained and re-used during future cleaning processes or for other purposes.

In some embodiments, the mixing gas is introduced to each power amplifier 211-214 separately via a separate inlet port 216 dedicated to each power amplifier. In some embodiments, the mixing gas is evacuated from the power amplifiers 211-214 via separate dedicated exhaust ports 218. In some embodiments, the laser generator 210 has one inlet port 216 and one exhaust port 218 servicing all the power amplifiers 211-214 simultaneously. In some embodiments, the mixing gas is introduced to each power amplifier individually or sequentially for cleaning one power amplifier at a time or in a particular order. The order may change based on contamination levels or operating performance in various embodiments. In some embodiments, two or more power amplifiers (211-214) are cleaned simultaneously and the mixing gas is introduced to each power amplifier at substantially the same time. In various embodiments, a monitoring system 284 is used to monitor various conditions to determine whether any cleaning processes should be initiated, as described later below.

In various embodiments where the laser source employed by the EUV lithography system 10 is a CO2 laser, In various embodiments, SiO2 is cleaned from the Au-coated catalyst by a hydrogen-doped gas comprising 100-X % of inert gas, such as Ar and X % H2 according to the following reaction equations:

$$SiO_2(s) + 2H_2(g) \rightarrow Si(s) + 2H_2O(g) \quad (1)$$

$$Si(s) + 2H_2(g) \rightarrow SiH_4(g) \quad (2)$$

where (s) designates a solid form, (g) designates a gaseous form and (l) designates a liquid form. SiO2(s) will react with H2(g) to form SiH4(g) and be evacuated or purged out the exhaust port(s) 218.

In various embodiments, toxic SiH4(g) will be removed from the mixing gas by conducting the exhaust gas into a water tank or similar (not shown) in communication with the filter 219. Removal of gaseous by-product SiH4 then proceeds according to the following reaction:

$$SiH_4(g) + 2H_2O(l) \rightarrow SiO_2(s) + 4H_2(g) \quad (3)$$

In some embodiments, the SiO2 by-product of the above reaction is sequestered and disposed of. In some embodiments, the by-product gaseous H2 is captured and recovered for disposal or for re-use as the mixing gas in future cleaning processes.

Figure 3A:
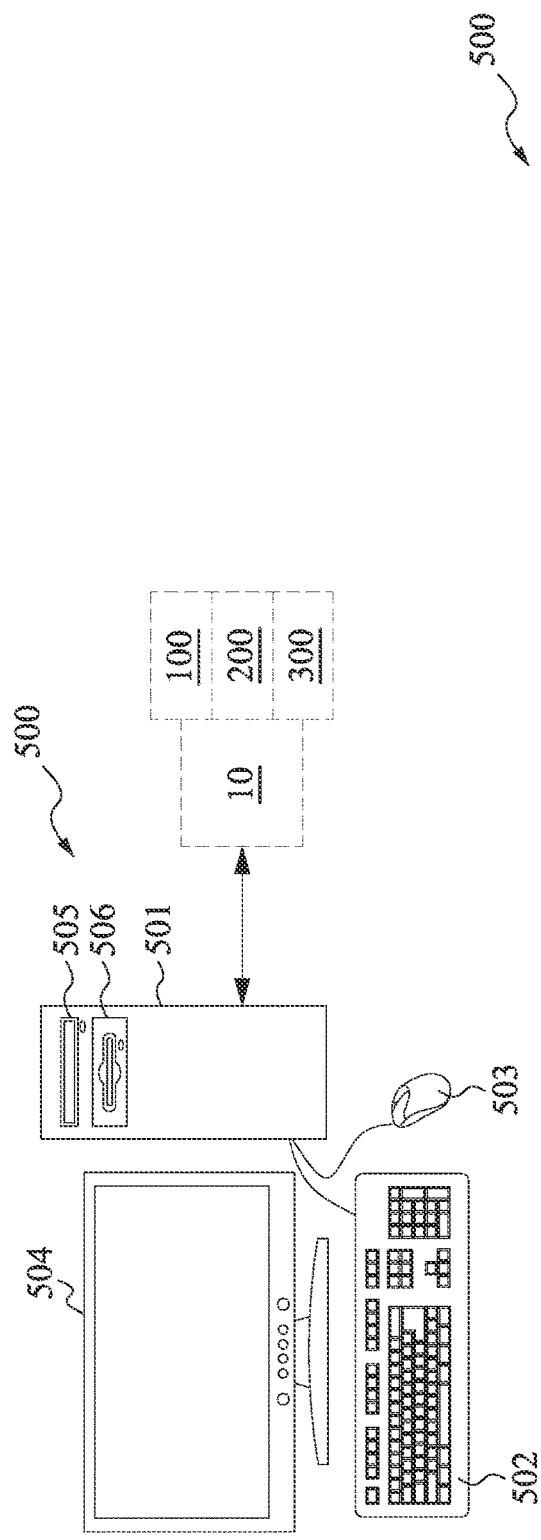
FIG. 3A and FIG. 3B are diagrams of a controller in accordance with some embodiments.
Figure 3B:
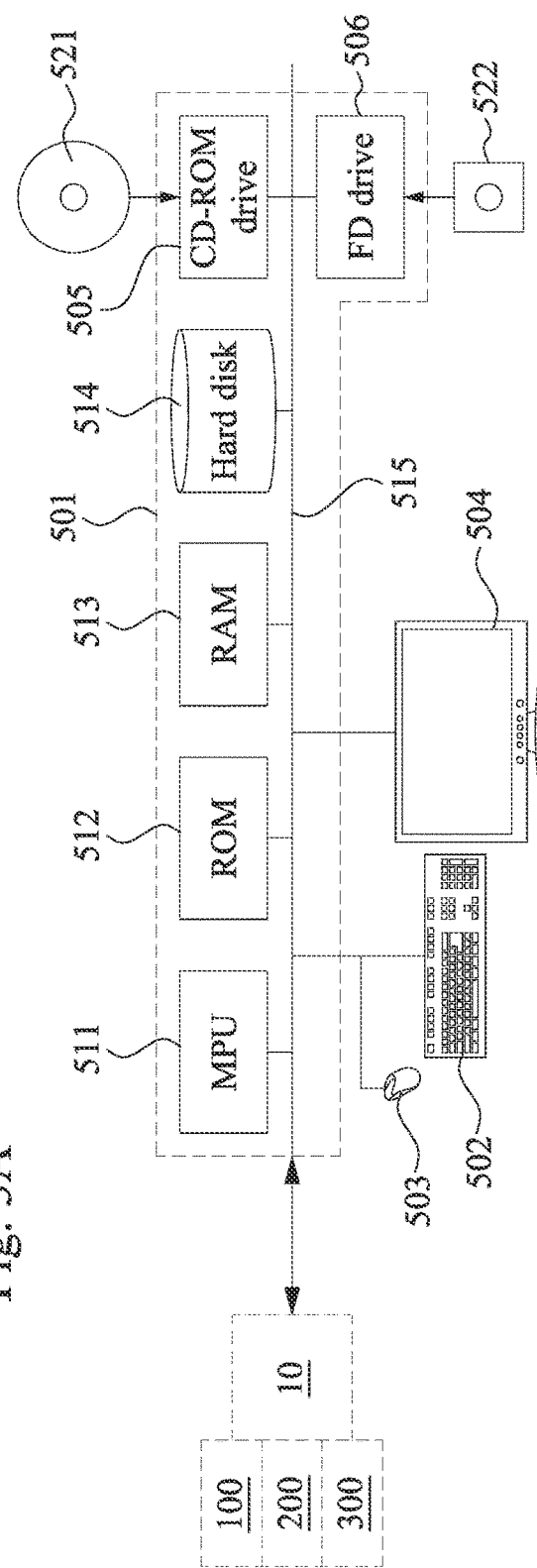

FIG. 3A and FIG. 3B illustrate a computer system 500 for controlling the EUV lithography system 10 and its components 100, 200 and 300 in accordance with some embodiments of the present disclosure. FIG. 3A is a schematic view of a computer system 500 that controls the lithography system 10 of FIG. 1A. In some embodiments, the computer system 500 is programmed to initiate a cleaning process of a catalyst in the power amplifiers (211, 212, 213, 214) of the laser generator 210, in which inlet ports 216 are opened and closed to allow the introduction and removal, respectively, of a mixing gas for reacting with contamination on a surface of the catalyst, as described herein. All of or a part of the cleaning processes, method and/or operations of the foregoing embodiments are realized using computer hardware and special purpose computer programs executed thereon. In FIG. 3A, the computer system 500 is provided with a computer 501 including an optical disk read only memory (e.g., CD-ROM or DVD-ROM) drive 505 and a magnetic disk drive 506, a keyboard 502, a mouse 503 (or other similar input device), and a monitor 504.

FIG. 3B is a diagram showing an internal configuration of the computer system 500. In FIG. 3B, the computer 501 is provided with, in addition to the optical disk drive 505 and the magnetic disk drive 506, one or more processors 511, such as a micro-processor unit (MPU) or a central processing unit (CPU); a read-only memory (ROM) 512 in which a program such as a boot up program is stored; a random access memory (RAM) 513 that is connected to the processors 511 and in which a command of an application program is temporarily stored, and a temporary electronic storage area is provided; a hard disk 514 in which an application program, an operating system program, and data are stored; and a data communication bus 515 that connects the processors 511, the ROM 512, and the like. Note that the computer 501 may include a network card (not shown) for providing a connection to a computer network such as a local area network (LAN), wide area network (WAN) or any other useful computer network for communicating data used by the computer system 500 and the lithography system 10.

The program for causing the computer system 500 to execute the process for controlling the EUV lithography system 10 of FIG. 1A (or components thereof) and/or to execute the process for the method of manufacturing a semiconductor device according to the embodiments disclosed herein are stored in an optical disk 521 or a magnetic disk 522, which are inserted into the optical disk drive 505 or the magnetic disk drive 506, and transmitted to the hard disk 514. Alternatively, the program may be transmitted via a network (not shown) to the computer system 500 and stored in the hard disk 514. At the time of execution, the program is loaded into the RAM 513. The program may be loaded from the optical disk 521 or the magnetic disk 522, or directly from a network. The program includes, in various embodiments, a cleaning program for periodically cleaning the catalyst of any of power amplifiers 211-214, which, among other functions, provides for removal of build-up on the catalyst and recovery of the mixing gas after removal through filtration as described in more detail later below. In various embodiments, the cleaning program controls a sequence of the cleaning of the power amplifiers 211-214. In various embodiments, the cleaning period lasts for nearly one hour or longer. In various embodiments, cleaning program is run after every seventh day of operation of the laser. In various embodiments, the cleaning program is run during operation of the laser. In various embodiments, the cleaning program is run during a maintenance period when the laser is not operating.

The stored programs do not necessarily have to include, for example, an operating system (OS) or a third party program to cause the computer 501 to execute the methods disclosed herein. The program may only include a command portion to call an appropriate function (module) in a controlled mode and obtain desired results in some embodiments. In various embodiments described herein, the computer 500 is in communication with one or more inlet ports 216 and exhaust ports 218 to control a cleaning process. In various embodiments, the computer 500 is also in operative communication with the lithography system 10 to control various functions thereof. In various embodiments, the computer 500 may automatically direct when to start and/or stop a cleaning process regarding the laser generator 210, for example, when a decrease in the power of the laser is detected by the lithography system 10.

Figure 4A:
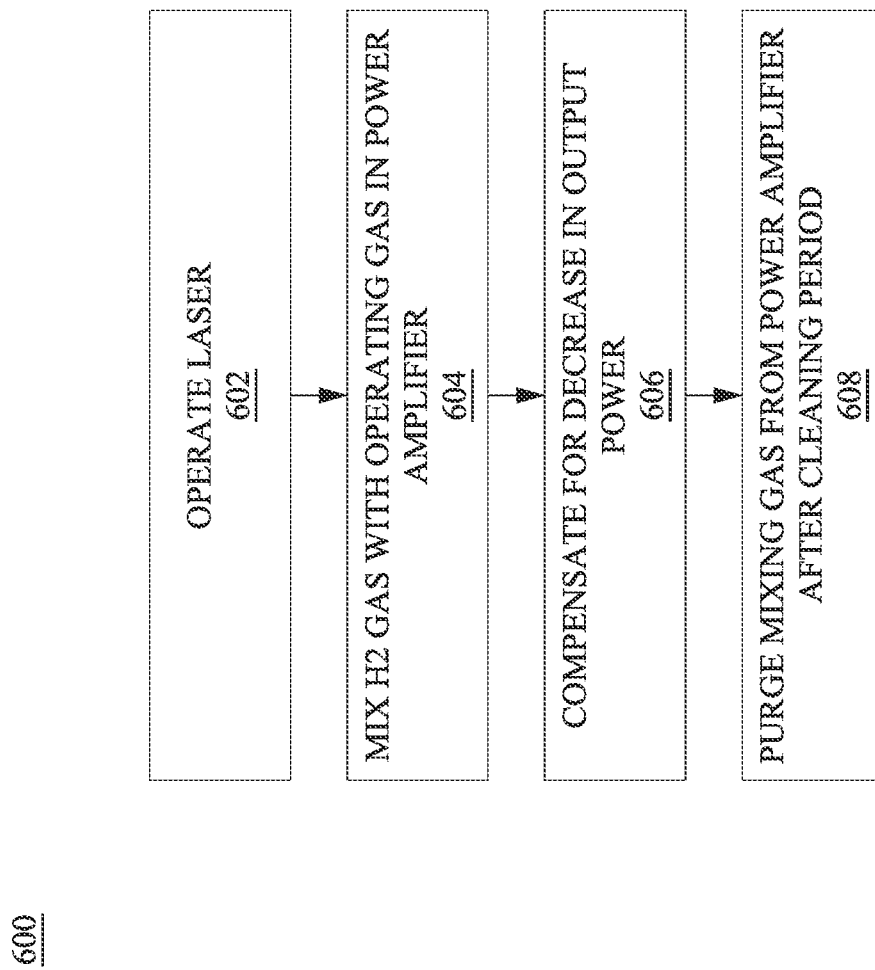
FIG. 4A is a flowchart depicting an online catalyst cleaning process in accordance with some embodiments
Figure 4B:
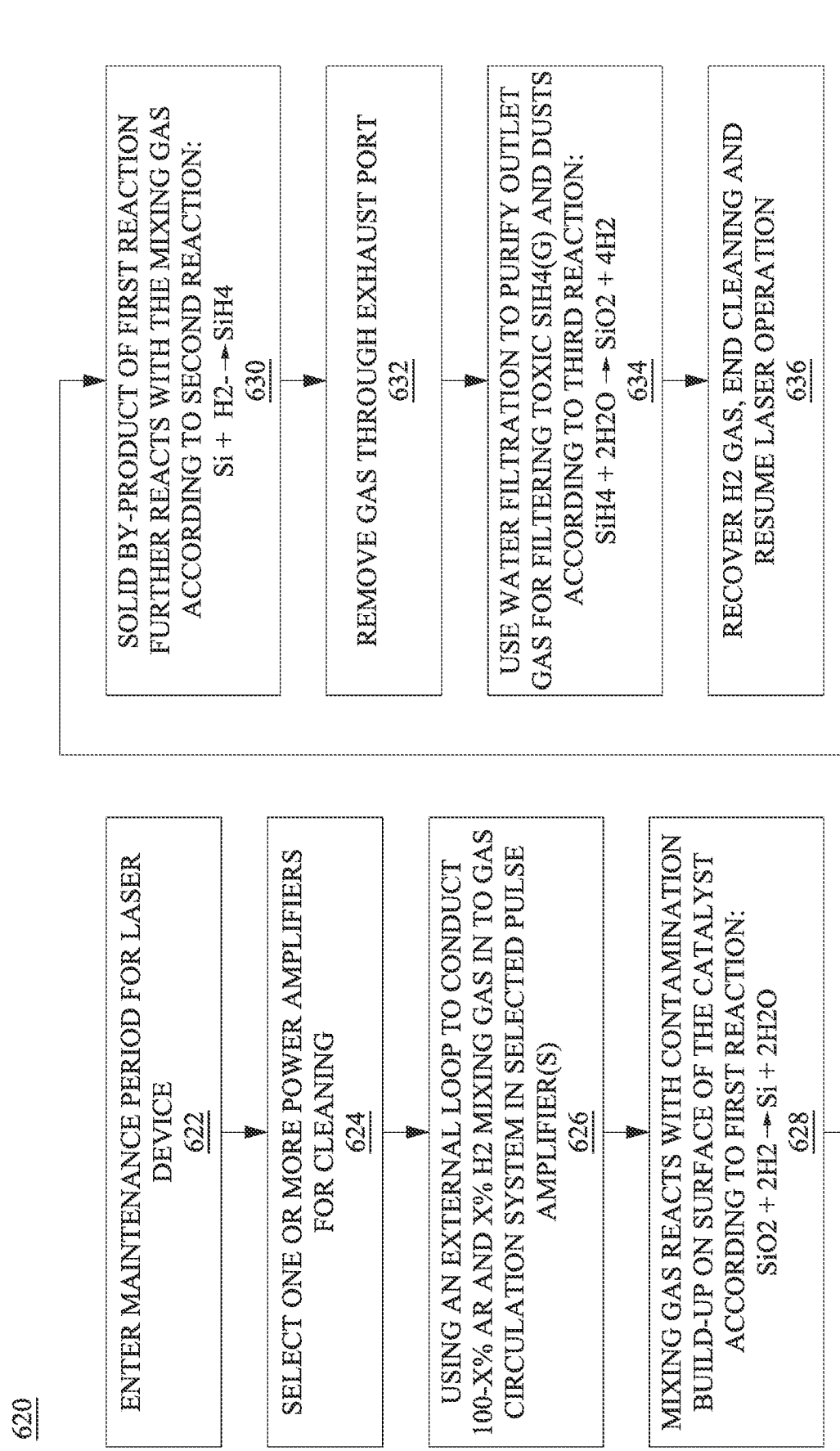
FIG. 4B is a flowchart depicting an offline catalyst cleaning process in accordance with some embodiments.

In various embodiments, the program performs the following operations described with respect to FIGS. 4A and 4B without manual input or intervention. Turning to FIG. 4A, therein is depicted an exemplary online cleaning process 600 for cleaning the catalyst of the pulse or power amplifiers 211-214 during operation of the laser in some embodiments. As the laser is being used (operation 602), a mixing gas (such as H2) is mixed with the operating gas (such as CO2) of the laser (operation 604) by, for example, opening the mixing gas inlet port 216. It has been observed, however, that the mixing gas causes an undesirable decrease in laser output, though the laser remains functional for its intended purpose in most cases. Accordingly, at operation 606, the laser generator 210 compensates for the power loss by boosting power or by modifying the switching of the power amplifiers 211-214 to re-establish full laser power. Finally, in accordance with operation 608, the mixing gas and all gaseous, solid and liquid by-products generated by the cleaning process is removed, for example, through exhaust port(s) 218 for filtration and recovery, after which the online cleaning process 600 ends.

Turning to FIG. 4B, therein is depicted and exemplary offline cleaning process 620 for cleaning the catalyst of the pulse or power amplifiers 211-214 during a maintenance period of the laser in various embodiments. At operation 622, a maintenance period of the laser commences. At operation 624, one or more of the pulse or power amplifiers 211-214 are selected for cleaning. Next, in various embodiments, an external loop or supply is used to conduct 100-x % Ar and x % H2 mixing gas into gas circulation system in the selected power amplifiers of the CO2 laser (operation 628). The mixing gas reacts with SiO2 contamination built-up on a surface of a power-preserving catalyst of the power amplifiers 211-214 (operation 626). In various embodiments, the mixing gas interacts with the build-up according to the first reaction: $SiO_2(s)+2H_2(g) \rightarrow Si(s)+2H_2O(g)$. Next, at operation 630, the solid by-product of the first reaction further reacts with the mixing gas according to the equation: $Si(s)+H_2(g) \rightarrow SiH_4(g)$. The mixing gas and by-products are then removed through the exhaust port(s) 218 (operation 632). At operation 634, the by-products are directed to a filter 219, which in various embodiments, is a water filtration system that uses water (H2O) to purify the exhaust or outlet gases generated by the first and second reactions above. In particular, in some embodiments, the SiH4 gaseous by-product and dust is filtered by the water supply according to the following third reaction: $SiH_4(g)+2H_2O(l) \rightarrow SiO_2(s)+4H_2(g)$. At operation 636, according to various embodiments, the H2 generated in the third reaction can be captured and recovered from the filter 219 and disposed of or re-used in additional cleaning processes. After the conclusion of offline cleaning process 620, the cleaning process ends, the exhaust port(s) 218 are closed and operation of the laser may resume.

Figure 5B:
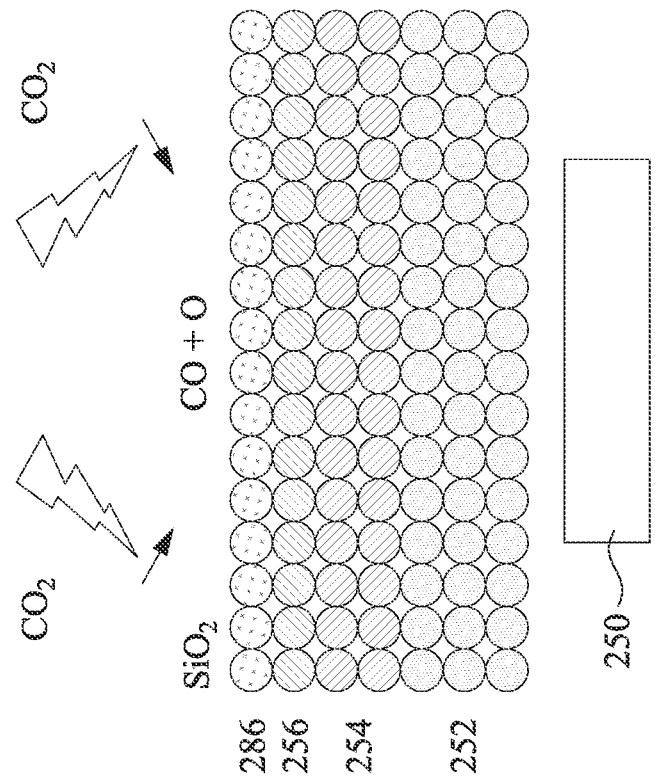
FIG. 5B is a diagram of a contaminated catalyst requiring removal of build-up in accordance with some embodiments.
Figure 5A:
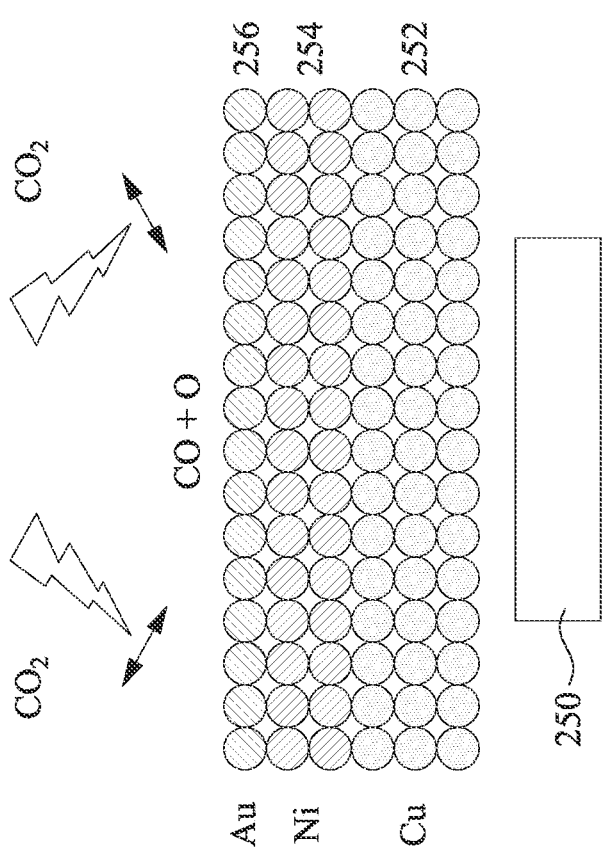
FIG. 5A is a diagram of an uncontaminated catalyst in accordance with some embodiments.

FIG. 5A depicts an exemplary catalyst 250 that is used in the power amplifiers 211-214 according to the various embodiments described above. FIG. 5A may also represent the state of the catalyst 250 after a cleaning process, such as online cleaning process 600 or offline cleaning process 620 is employed. In various embodiments, the catalyst 250 comprises several metal layers. In some embodiments, the catalyst comprises one or more layers of copper (Cu) 252 disposed below one or more layers of nickel (Ni) 254. A layer of gold (Au) 256 is disposed above the Ni layer(s) 254 in various embodiments. The Au layer 256 is intended to assisting with the recombination of CO and O2 generated in the pulse amplifiers by the CO2 laser during operation. By recombining the gaseous CO and O2 into CO2, the service life of a CO2 laser is extended.

However, as described above, the operation of the laser further causes a contamination of the Au-coated catalyst 250 over time. This results in a progressive and permanent degradation in both the efficiency and operating power of laser that increases over time and will eventually result in the CO2 laser being inoperable or impractical for further operation without extensive maintenance or overhaul. FIG. 5B illustrates a build-up of a contamination 286, such as SiO2 in various embodiments, on the Au layer 256 of the catalyst 250. To counter this, and according to the aforementioned embodiment, a hydrogen-doped mixing gas is used to remove the SiO2 contamination layer 286 on the surface of the Au layer 256 disposed on the catalyst 250, during either an online cleaning process 600 or an off-line cleaning process 620 performed on the CO2 laser. Preventing the decrease of CO2 laser power decay will keep EUV generation efficiency and wafer production like new. Maintaining the laser in such manner is critical for maintaining production efficiency where many EUV lithography systems 10 are used for mass semiconductor device production, i.e., in high-volume manufacturing (HVM) environments.

In various embodiments, power amplifiers 211-214 of CO2 laser amplifier use a gain medium of N2, CO2 or He to generate population inversion for lasing. In various embodiments, the laser is a CO2 laser. After a population is prepared, a seed laser propagates via an operating gas and then is amplified. In this process, CO2 molecules will be consumed and become CO (carbon monoxide) and O2. In its original design, Au is used as the catalyst 250 to recombine CO and O2 back into CO2. Au is coated on the inner surface of the circulating gas pipeline in the power amplifiers 214-214. When CO and O2 circulate, CO and O2 will go through the pipelines and the catalyst will correspondingly recover CO2. However, it has been discovered that an SiO2 cover layer 286 will coat a surface of the Au layer 256 of the catalyst 250 gradually over the course of amplifier operation. As a result, amplifier gain (and correspondingly, laser power) will decay because additional CO2 is consumed by the SiO2 build-up. The observed laser output decay rate of EUV lithography machines is on the order of ten percent per year. The present disclosure is directed to introduce hydrogen-doped mixing gas into the gas circulation system of the power amplifiers 211-214 during online operation of the laser or during periodic maintenance when the laser is offline.

In various embodiments, a monitoring system 284 is used to monitor various conditions to determine whether a cleaning process, such as online cleaning process 600 or an offline cleaning process 620 should be initiated to clean the power amplifiers 211-214 of the laser generator 210 of the excitation laser source apparatus 200. In some embodiments, the monitoring system 284 monitors an amount of CO in the gas circulation system of the power amplifiers 211-214 using a CO sensor or the like. In such embodiments, if an established threshold of CO is detected, an alert may be issued by the monitoring system 284 and a cleaning process (600, 620) may be initiated. In some embodiments, the monitoring system 284 measures a thickness of a SiO2 layer 286 built up at one or more places on the surface of the Au layer 256 of the catalyst 250. In such embodiments, if an established threshold of SiO2 is detected, an alert may be issued by the monitoring system 284 and a cleaning process (600, 620) may be initiated. In some embodiments, the monitoring system 284 monitors a power level of the CO2 laser during operation. In such embodiments, if a power level of the CO2 laser falls below an established limit, an alert may be issued by the monitoring system 284 and a cleaning process (600, 620) may be initiated.

As described in certain embodiments of the foregoing descriptions, a recovery of CO2 gas from CO back to CO2 using an Au catalyst of a CO2 laser pulse amplifier has been shown to be effective in extending the useful life of the CO2 laser. By continuously eliminating the long-term energy decay of CO2 laser, its energy consumption can be kept close to its power levels at initial use. This, in turn, prevents EUV energy decay in the later stages of the EUV lithography system 10, such as the exposure tool 300. In various embodiments, the cleaning processes 600, 620 can be applied to various other components of the EUV lithography system 10, other than the examples described above, as necessary and practicable.

In various embodiments, other gases may be used to remove the build-up of the SiO2 layer 286 in place of or in combination with the supply of H2 gas. For example, gaseous hydrogen fluoride (HF), ammonia (NH3), nitrogen trifluoride (NF3) or other gases with similar chemical and reaction properties may be employed.

In various embodiments, an apparatus for manufacturing semiconductors comprises a power amplifier for powering a laser, a catalyst disposed in the power amplifier; a supply of mixing gas; an inlet port coupled to the supply for introducing a mixing gas to an interior of the power amplifier so that the mixing gas contacts a surface of the catalyst having a build-up thereon generated during operation of the laser. The mixing gas reacts with and removes the build-up by generating gaseous by-products. An exhaust port is provided for removing the gaseous by-products from the power amplifier. In various embodiments, a filter having a water supply receives the gaseous by-products from the exhaust port, and the water supply removes and recovers the mixing gas from the gaseous by-products.

In various embodiments, a method for preserving the power of a laser comprises supplying mixing gas via an inlet port of a pulse or power amplifier of a laser. In various embodiments, the power amplifier uses an internal catalyst. An inlet port is opened, for example, during a maintenance period of the laser so that the mixing gas can be conducted from the input port to an interior of the power amplifier. The mixing gas contacts a surface of the catalyst having a build-up thereon generated during operation of the laser. In some embodiments, the mixing gas reacts with and removes the build-up by generating gaseous by-products.

In various embodiments, a method for reducing power decay in a laser comprises: operating a laser using a power amplifier having a catalyst, where a contamination builds up on a surface of the catalyst over time; providing a mixing gas to the surface of the catalyst during a maintenance period of the laser; allowing the mixing gas to react with and remove the contamination by generating gaseous by-products; providing an exhaust port for removing the gaseous by-products from the power amplifier; and providing a filter having a water supply for receiving the gaseous by-products from the exhaust port and recovering at least some of the mixing gas from the gaseous by-products.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for manufacturing semiconductors, comprising
    a power amplifier to power a laser;
    a catalyst disposed in the power amplifier;
    an inlet port coupled to a supply and configured to introduce a mixing gas to an interior of the power amplifier during a cleaning operation so that the mixing gas contacts a surface of the catalyst having a build-up thereon, whereby the mixing gas reacts with and removes the build-up by generating gaseous by-products; and
    an exhaust port configured to remove the gaseous by-products from the power amplifier at an end of the cleaning operation.

2. The apparatus of claim 1, where the mixing gas is introduced during a maintenance period.

3. The apparatus of claim 1, wherein the catalyst comprises a gold surface.

4. The apparatus of claim 1, wherein the mixing gas comprises a hydrogen-doped argon gas.

5. The apparatus of claim 1, wherein the laser is a $CO_2$ gas laser.

6. The apparatus of claim 1, further comprising a circuitry configured to control the cleaning operation, wherein the power amplifier comprises a plurality of power amplifiers arranged in sequential stages.

7. The apparatus of claim 6, wherein the circuitry is configured to introduce the mixing gas to each power amplifier separately.

8. The apparatus of claim 6, wherein the circuitry is configured to introduce the mixing gas to each power amplifier sequentially.

9. The apparatus of claim 6, wherein the circuitry is configured to introduce the mixing gas to each power amplifier at substantially the same time.

10. The apparatus of claim 1, wherein the power amplifier has a separate dedicated inlet port and exhaust port.

11. A method for preserving power of a laser, comprising:
    introducing a mixing gas from an inlet port to an interior of a power amplifier for the laser during a maintenance of the laser, the power amplifier having a catalyst;
    allowing the mixing gas to react with and remove a contamination built upon a surface of the catalyst so that gaseous by-products are generated; and
    removing the gaseous by-products from the power amplifier through an exhaust port.

12. The method of claim 11, further comprising providing a filter having a water supply for receiving the gaseous by-products from the exhaust port, whereby the water supply removes the mixing gas.

13. The method of claim 11, wherein the mixing gas is introduced to the power amplifier for at least one hour after every seventh day of operation of the laser.

14. The method of claim 11, wherein the surface of the catalyst comprises a layer of gold.

15. The method of claim 11, wherein the mixing gas comprises a hydrogen-doped argon gas.

16. The method of claim 11, wherein the mixing gas comprises hydrogen ($H_2$), the contamination is silicon dioxide ($SiO_2$) and a reaction of the mixing gas and the contamination proceeds according to:

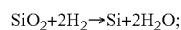

$SiO_2 + 2H_2 \rightarrow Si + 2H_2O$;

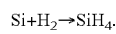

$Si + H_2 \rightarrow SiH_4$.

17. A method for cleaning a power amplifier of a laser, comprising:
    introducing a mixing gas into the power amplifier through an inlet port during an operation of the laser, the power amplifier having a catalyst;
    allowing the mixing gas to react with and remove a contamination built upon a surface of the catalyst so that gaseous by-products are generated; and
    removing the mixing gas and the gaseous by-products from the power amplifier through an exhaust thereof after cleaning of the power amplifier.

18. The method of claim 17, further comprising compensating for a power loss by boosting a power of the power amplifier to re-establish a full laser power.

19. The method of claim 17, wherein the mixing gas comprises a hydrogen-doped argon gas.

20. The method of claim 19, wherein the mixing gas comprises X weight percent argon and 100-X weight percent of hydrogen ($H_2$), where X is a number that is greater than one and less than 100.

* * * * *